(12) United States Patent
Shiozaki

(10) Patent No.: US 8,035,296 B2
(45) Date of Patent: Oct. 11, 2011

(54) ORGANIC LIGHT-EMITTING APPARATUS WITH RESIN LAYER EXTENDING FROM LIGHT-EMITTING SECTION OVER WIRING LINES

(75) Inventor: Atsushi Shiozaki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 140 days.

(21) Appl. No.: 12/123,088

(22) Filed: May 19, 2008

(65) Prior Publication Data
US 2008/0309231 A1    Dec. 18, 2008

(30) Foreign Application Priority Data

Jun. 12, 2007  (JP) .................................. 2007-155373
Mar. 27, 2008  (JP) .................................. 2008-084110

(51) Int. Cl.
*H01J 1/62*     (2006.01)
*H01J 63/04*    (2006.01)
(52) U.S. Cl. ..................... 313/504; 313/498; 313/506
(58) Field of Classification Search ........... 313/498–512
See application file for complete search history.

(56) References Cited

U.S. PATENT DOCUMENTS

| | | | |
|---|---|---|---|
| 6,992,332 B2 | 1/2006 | Yamazaki et al. | 257/83 |
| 7,053,549 B2 | 5/2006 | Omura et al. | 313/512 |
| 2001/0026125 A1* | 10/2001 | Yamazaki et al. | 313/505 |
| 2002/0036462 A1* | 3/2002 | Hirano | 313/506 |
| 2003/0042849 A1* | 3/2003 | Ogino | 313/504 |
| 2003/0146695 A1* | 8/2003 | Seki | 313/506 |
| 2003/0164674 A1 | 9/2003 | Imamura | |
| 2005/0218396 A1 | 10/2005 | Tsuchiya et al. | |
| 2006/0113900 A1 | 6/2006 | Oh | |
| 2006/0270305 A1 | 11/2006 | Imamura | |
| 2009/0179566 A1 | 7/2009 | Imamura | |

FOREIGN PATENT DOCUMENTS

| | | |
|---|---|---|
| CN | 1458640 A | 11/2003 |
| CN | 1551686 A | 12/2004 |
| JP | 2000-353594 | 12/2000 |
| JP | 2001-013893 | 1/2001 |

OTHER PUBLICATIONS

Chinese Office Action issued in the counterpart application No. 200910254148.7 dated Feb. 1, 2011 with English-language translation—14 pages.

European search report issued in corresponding Application No. 08156446.0 dated Jun. 22, 2011; 7 pages.

* cited by examiner

*Primary Examiner* — Joseph L Williams
*Assistant Examiner* — Kevin Quarterman
(74) *Attorney, Agent, or Firm* — Fitzpatrick, Cella, Harper & Scinto

(57) ABSTRACT

An organic light-emitting apparatus includes a substrate, a plurality of organic light-emitting devices which are arranged above the substrate and which form a light-emitting section, a circuit section which is disposed around the light-emitting section and which controls the operation of the organic light-emitting devices, a plurality of wiring lines extending between the light-emitting section and the circuit section, and a resin layer which extends in the light-emitting section and which extends from the light-emitting section over the wiring lines. The resin layer has gaps extending between the wiring lines.

20 Claims, 8 Drawing Sheets

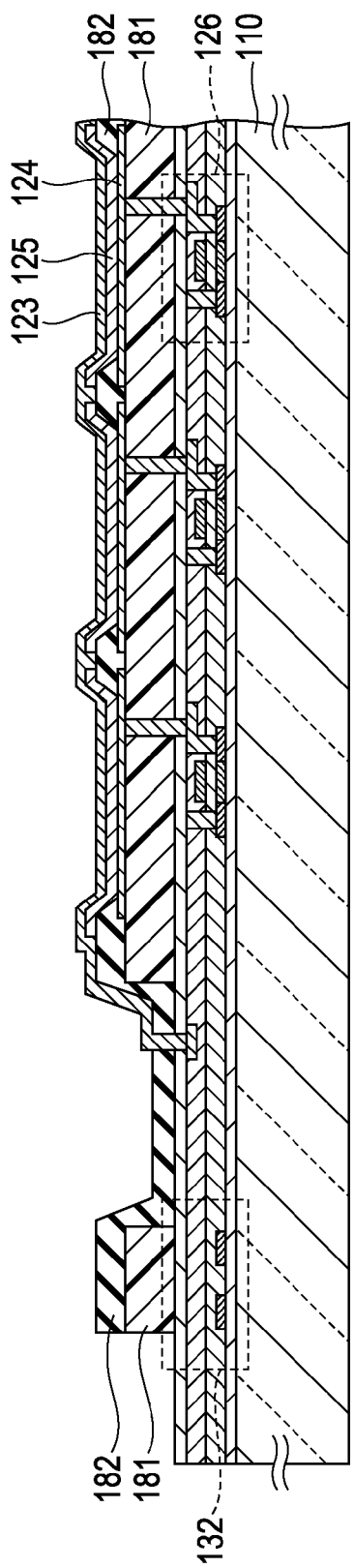
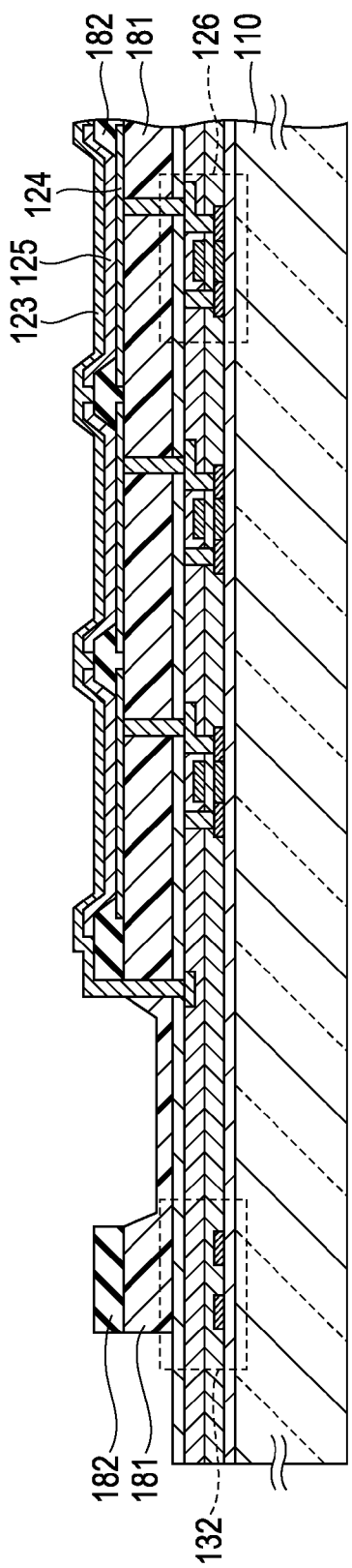

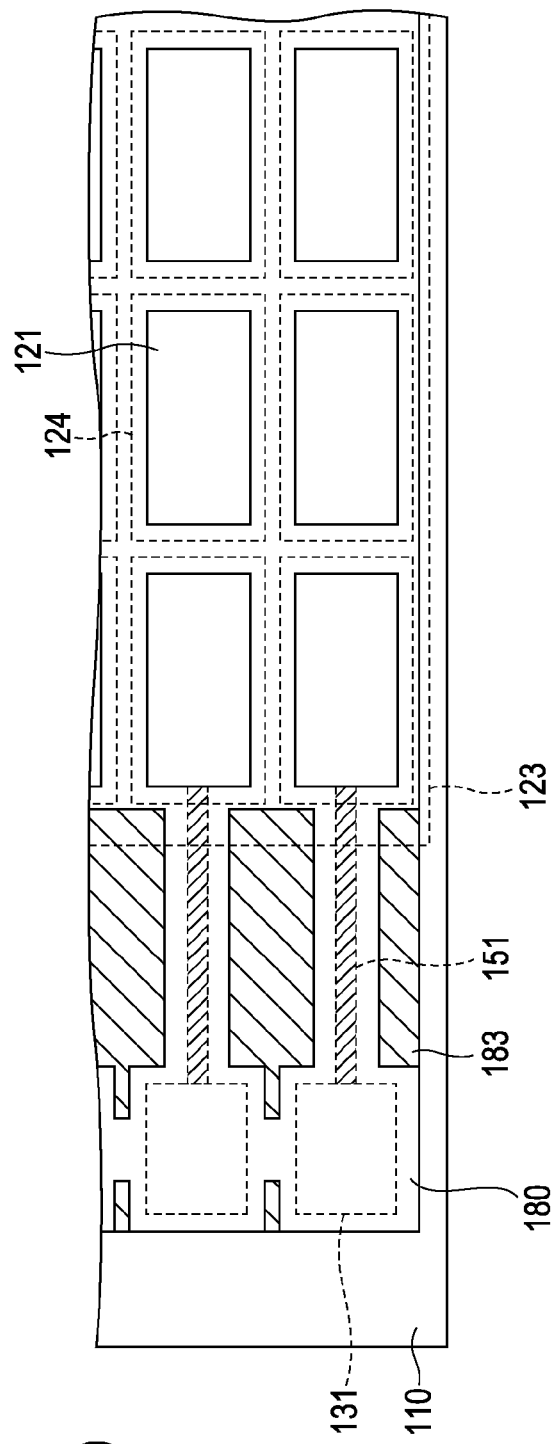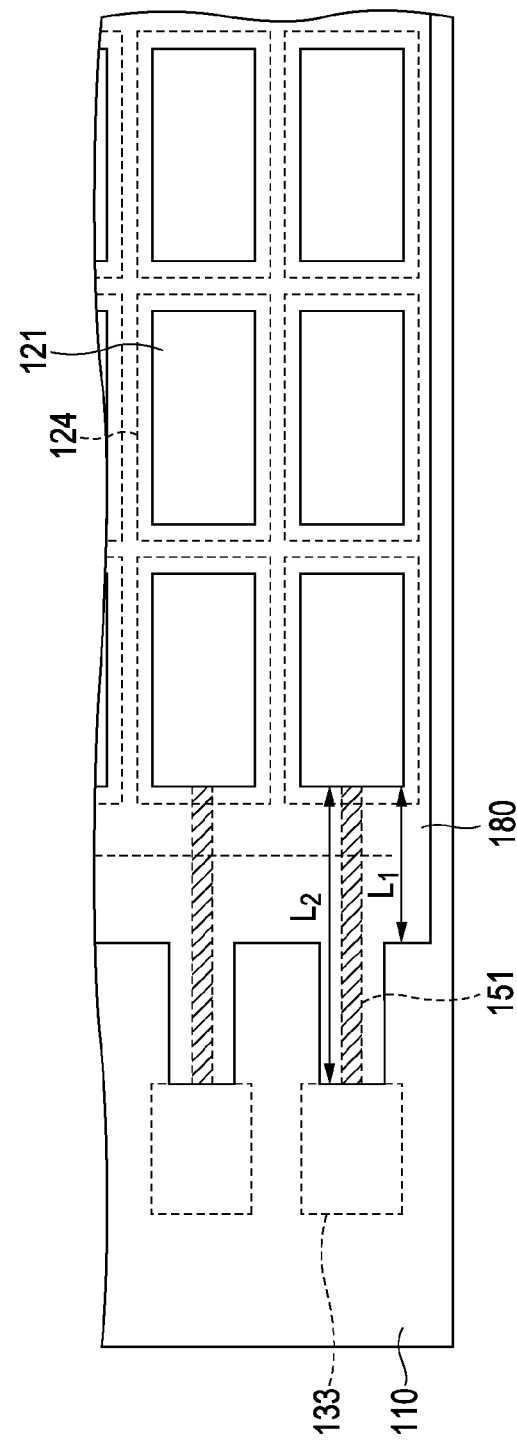

ORGANIC LIGHT-EMITTING APPARATUS WITH RESIN LAYER EXTENDING FROM LIGHT-EMITTING SECTION OVER WIRING LINES

BACKGROUND OF THE INVENTION

1. Field of the Invention

The present invention relates to an organic light-emitting apparatus including a plurality of organic light-emitting devices.

2. Description of the Related Art

Organic light-emitting devices under development each principally include the following components: a first electrode disposed above a substrate; an organic compound layer which is disposed on the first electrode and which includes a plurality of sub-layers having different functions such as a charge transport function and a charge recombination function, and a second electrode disposed on the organic compound layer. The organic light-emitting devices are arranged above the substrate to form a light-emitting section. An organic light-emitting apparatus includes the above members. A circuit section for driving the organic light-emitting devices is disposed above the substrate and extends along the light-emitting section. The circuit and light-emitting sections are connected to each other with wiring lines.

Japanese Patent Laid-Open No. 2001-013893 (hereinafter referred to as Patent Document 1) and Japanese Patent Laid-Open No. 2000-353594 (hereinafter referred to as Patent Document 2) disclose organic light-emitting apparatuses that each include a light-emitting section including a plurality of organic light-emitting devices arranged above a substrate, a circuit section located outside the light-emitting section, wiring lines extending outside the light-emitting section, and a resin layer. According to Patent Documents 1 and 2, the resin layer extends from the light-emitting section over the circuit section and the wiring lines.

The organic light-emitting apparatus disclosed in Patent Document 1 further includes an interlayer insulating layer (planarization layer) which is made of a resin material and which extends between pixel thin-film transistors and pixel electrodes arranged in a pixel section and also extends over a source-side driving circuit (FIG. 11 and Example 11 of Patent Document 1). The interlayer insulating layer (planarization layer) covers surface irregularities and is effective in preventing layers deposited in the organic light-emitting devices from being broken, being short-circuited, or irregularly emitting light.

The organic light-emitting apparatus disclosed in Patent Document 2 further includes a bank which is made of an organic material and which extends between and around a plurality of pixels arranged in a display section and also extends to a data-side driving circuit and scanning-side driving circuit arranged outside the display section (FIG. 3 of Patent Document 2). The bank is effective in preventing organic compounds contained in the neighboring pixels from being mixed with each other.

A light-emitting apparatuses including organic light-emitting devices needs to be manufactured in such a manner that moisture and oxygen are strictly controlled so as not to penetrate the organic light-emitting devices, because the organic light-emitting devices are extremely susceptible to moisture and oxygen. When the light-emitting apparatus includes a resin layer (planarization layer) disposed between a substrate and lower electrodes which are included in the organic light-emitting devices and which are located on the substrate side or a resin layer (separation layer) extending between and around the organic light-emitting devices, a method for manufacturing the light-emitting apparatus includes a dehydration step because the resin layer contains a large amount of moisture. However, it is difficult to sufficiently remove moisture from the resin layers through the dehydration step. Therefore, there is a problem in that the moisture contained in the resin layer penetrates the organic light-emitting devices to damage the organic light-emitting devices. The damage of the organic light-emitting devices caused by the moisture contained in the resin layer is particularly serious for regions around a light-emitting section including the organic light-emitting devices. According to Patent Documents 1 and 2, although those resin layers are located around those light-emitting sections, the organic light-emitting apparatuses are unprotected from the problem due to moisture and therefore have a problem that the moisture contained in those resin layers damages those organic light-emitting devices.

This resin layer extends from this light-emitting section over wiring lines extending around this light-emitting section and also extends over a circuit section so as to physically protect these wiring lines and this circuit section from external contacts and so as to electrically insulate these wiring lines and this circuit section from electrodes of these organic light-emitting devices. Therefore, this resin layer needs to extend over this circuit section and wiring lines which are located around this light-emitting section and which are electrically connected to these organic light-emitting devices and moisture needs to be prevented from penetrating these organic light-emitting devices.

SUMMARY OF THE INVENTION

The present invention provides an organic light-emitting apparatus including a resin layer that extends from a light-emitting section over a circuit section and wiring lines arranged around the light-emitting section. The moisture contained in the resin layer can be prevented from affecting organic light-emitting devices arranged in the light-emitting section.

An organic light-emitting apparatus according to a first aspect of the present invention includes wiring lines extending around a light-emitting section and also includes a resin layer extending from the light-emitting section over the wiring lines. The moisture contained in the resin layer is reduced in such a manner that a portion of the resin layer that is located around the light-emitting section is minimized. That is, the organic light-emitting apparatus includes a substrate, a plurality of organic light-emitting devices which are arranged above the substrate and which form the light-emitting section, a circuit section which is disposed around the light-emitting section and which controls the operation of the organic light-emitting devices, the wiring lines that extends between the light-emitting section and the circuit section, and the resin layer which extends in the light-emitting section and which extends from the light-emitting section over the wiring lines. The resin layer has gaps extending between the wiring lines.

An organic light-emitting apparatus according to a second aspect of the present invention includes a substrate, a plurality of organic light-emitting devices which are arranged above the substrate and which form a light-emitting section, a circuit section which is disposed around the light-emitting section and which controls the operation of the organic light-emitting devices, a plurality of wiring lines extending between the light-emitting section and the circuit section, and a resin layer which extends in the light-emitting section and which extends from the light-emitting section over the wiring lines. The resin layer has portions which extend between the wiring lines and which are thinner than portions of the resin layer that extend over the wiring lines.

An organic light-emitting apparatus according to a third aspect of the present invention includes a substrate, a plurality of organic light-emitting devices which are arranged above the substrate and which form a light-emitting section, a circuit section which is disposed around the light-emitting section and which controls the operation of the organic light-emitting devices, a plurality of wiring lines extending between the light-emitting section and the circuit section, and a resin layer which extends in the light-emitting section and which extends from the light-emitting section over the wiring lines. Portions of the resin layer that extend over the wiring lines are thinner than a portion of the resin layer that extends in the light-emitting section.

An organic light-emitting apparatus according to a fourth aspect of the present invention includes a substrate, a plurality of organic light-emitting devices which are arranged above the substrate and which form a light-emitting section, a circuit section which is disposed around the light-emitting section and which controls the operation of the organic light-emitting devices, a plurality of wiring lines extending between the light-emitting section and the circuit section, and a resin layer which extends in the light-emitting section and which extends from the light-emitting section over the wiring lines. A portion of the resin layer that overlies the circuit section is thinner than a portion of the resin layer that extends in the light-emitting section.

According to the present invention, the amount of oxygen, moisture, and/or the like contained in an organic light-emitting apparatus is kept low in such a state that a known function of a resin layer is maintained, whereby the organic light-emitting apparatus can be prevented from being deteriorated. In particular, organic light-emitting devices arranged in a light-emitting section can be prevented from being deteriorated. This allows the organic light-emitting apparatus to have high reliability.

Further features of the present invention will become apparent from the following description of exemplary embodiments with reference to the attached drawings.

BRIEF DESCRIPTION OF THE DRAWINGS

FIG. 8 is a schematic sectional view showing another configuration of the end portion shown in FIG. 2.

FIG. 9 is a schematic sectional view showing another configuration of the end portion shown in FIG. 2.

FIG. 10 is a schematic sectional view showing another configuration of the end portion shown in FIG. 2.

FIG. 11 is a schematic sectional view showing another configuration of the end portion shown in FIG. 2.

DESCRIPTION OF THE EMBODIMENTS

Figure 1A:
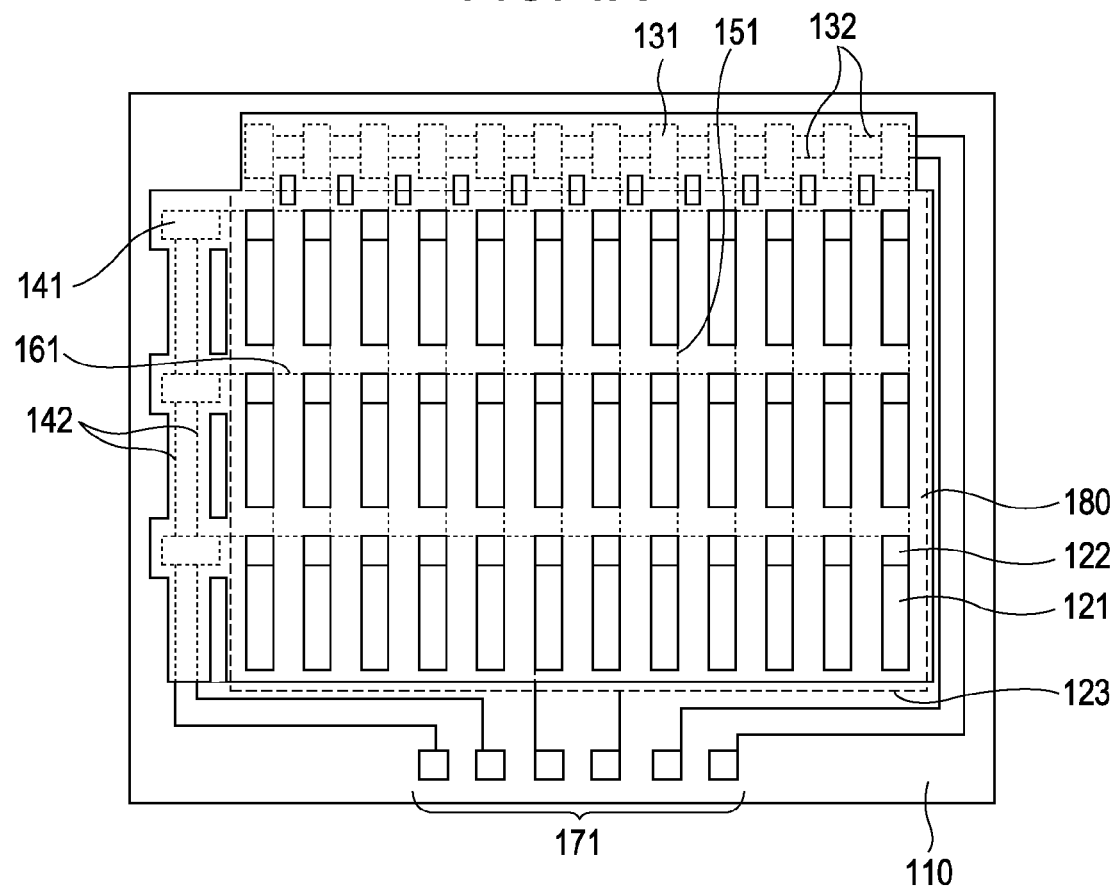
FIG. 1A is a schematic plan view of an organic light-emitting apparatus according to an embodiment of the present invention and FIG. 1B is a block diagram of the organic light-emitting apparatus.

An organic light-emitting apparatus according to an embodiment of the present invention includes a substrate, a plurality of organic light-emitting devices which are arranged above the substrate and which form a light-emitting section, a circuit section which is disposed around the light-emitting section and which controls the operation of the organic light-emitting devices, a plurality of wiring lines extending between the light-emitting section and the circuit section, and a resin layer which extends in the light-emitting section and which extends from the light-emitting section over the wiring lines.

The light-emitting section contains the organic light-emitting devices and displays information by controlling the operation of the organic light-emitting devices and/or the intensity of the light emitted therefrom. The organic light-emitting devices each include a first electrode, an organic compound layer, and a portion of a second electrode arranged above the substrate in that order. The application of a current between the first and second electrodes excites a luminescent material contained in the organic compound layer. When the excited luminescent material returns to the ground state, light is emitted therefrom. The circuit section controls the operation of the organic light-emitting devices, the intensity of the light emitted from the organic light-emitting devices, the timing of light emission from the organic light-emitting devices, and/or the like and includes circuit devices such as switching devices and capacitors. The organic light-emitting devices are electrically connected to the circuit devices through the wiring lines. The circuit devices and the wiring lines are formed above the substrate by patterning.

The resin layer extends from the light-emitting section over the wiring lines and contains a resin. The resin layer may have various configurations. The resin layer may be, for example, a planarization layer extending between the substrate and the first electrodes in the light-emitting section, or a separation layer extending between and around the organic light-emitting devices. Since the resin layer extends over the wiring lines, the wiring lines can be protected from external impact. Furthermore, the wiring lines can be protected from mechanical or chemical damage during processing. This leads to an increase in yield. Furthermore, it is possible to reduce the parasitic capacitance between the wiring lines and the first and second electrodes and also possible to provide a function of facilitating operational response.

In the organic light-emitting apparatus, the resin layer follows the pattern of the wiring lines, that is, the resin layer extends over the wiring lines so as to follow the shape of the wiring lines. In particular, the resin layer has gaps which extend between the wiring lines and through which a layer underlying the wiring lines is exposed. Alternatively, the resin layer has portions which extend between the wiring lines and which are thinner than portions of the resin layer that extend over the wiring lines. The resin layer may entirely or partially follow the shape of the wiring lines. This allows the resin layer, which extends over the wiring lines, to be minimized, leading to a reduction in the amount of moisture and/or oxygen contained in the resin layer. The resin layer may extend over the circuit section beyond the wiring lines. In this case, the resin layer preferably follows the shape of the circuit section. In particular, the resin layer preferably has gaps which extend between the circuit devices and through which a layer underlying the circuit devices is exposed. Alternatively, the resin layer preferably has portions which extend between the circuit devices and which are thinner than portions of the resin layer that extend over the wiring lines. An end portion of a pattern preferably has a forward tapered shape such that a layer overlying this pattern is prevented from being broken. This pattern is preferably formed in a step of forming openings or through-holes in the light-emitting section by patterning in the sense of not increasing the number of manufacturing steps and may be formed in another step.

Alternatively, the resin layer portions extending over the wiring lines may be thinner than a portion of the resin layer that extends over the light-emitting section. That is, the resin layer may have a configuration in which the resin layer portions extending over the wiring lines are uniform independently of the shape of the wiring lines and are thinner than the resin layer portion extending over the light-emitting section. This allows a portion of the resin layer that is located around the light-emitting section to be minimized, leading to a reduction in the amount of moisture and/or oxygen contained in the resin layer. When the resin layer extends to the circuit section beyond the wiring lines, that is, when the resin layer extends over the circuit section and the wiring lines, a portion of the resin layer that extends over the circuit section may be thinner that the resin layer portion extending over the light-emitting section. This also allows the resin layer portion located around the light-emitting section to be minimized, leading to a reduction in the amount of moisture and/or oxygen contained in the resin layer.

An organic light-emitting apparatus according to an embodiment of the present invention will now be described with reference to the attached drawings.

Figure 1B:
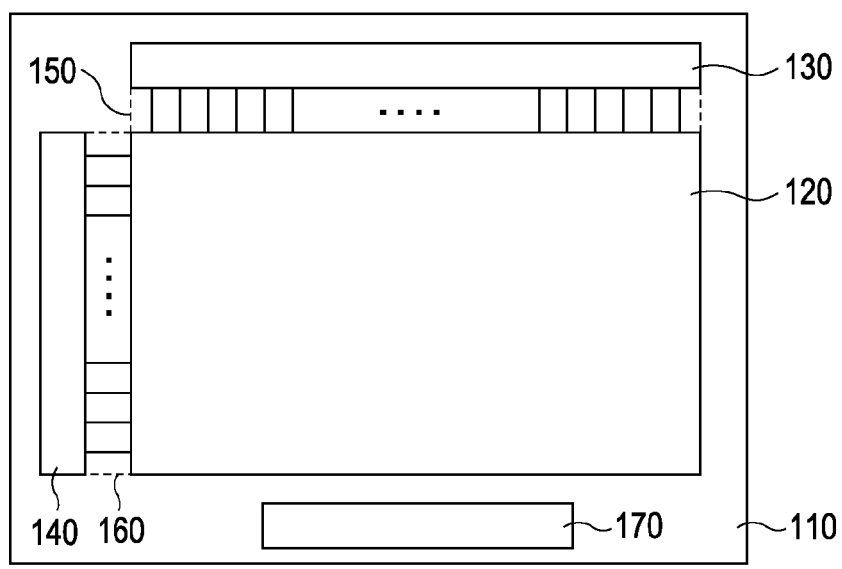

FIG. 1A is a schematic plan view of the organic light-emitting apparatus. FIG. 1B is an illustration showing sections of the organic light-emitting apparatus. The two-dimensional positions of members shown in FIG. 1A correspond to those shown in FIG. 1B.

With reference to FIGS. 1A and 1B, reference numeral 110 represents a substrate, reference numeral 120 represents a light-emitting section, reference numeral 130 represents a column circuit section, reference numeral 140 represents a row circuit section, reference numeral 150 represents a column wiring section, reference numeral 160 represents a row wiring section, and reference numeral 170 represents a terminal section. The light-emitting section 120 includes organic light-emitting devices 121, connecting portions 122, a second electrode 123, and a resin layer 180. The column circuit section 130 includes first control circuits 131 and first control lines 132. The row circuit section 140 includes second control circuits 141 and second control lines 142. The column wiring section 150 includes first data lines 151. The row wiring section 160 includes second data lines 161. The resin layer 180 extends from the light-emitting section 120 over the first and second wiring lines 151 and 161. With reference to FIG. 1A, the resin layer 180 extends to the column and row circuit sections 130 and 140 beyond the column and row wiring sections 150 and 160. The terminal section 170 includes connection terminals 171.

The substrate 110 is a base material and is overlaid with the light-emitting section 120, the column and row circuit sections 130 and 140, the column and row wiring sections 150 and 160, and the terminal section 170. The light-emitting section 120 is disposed above the substrate 110 and includes the organic light-emitting devices 121. The organic light-emitting devices 121 each include a first electrode (not shown), an organic compound layer (not shown), and a portion of the second electrode 123, these components being arranged above the substrate 110 in that order. The organic light-emitting devices 121 emit light when currents are applied between the second electrode 123 and the first electrodes.

The operation of the organic light-emitting devices 121 is controlled by the column circuit section 130, which includes the first control circuits 131, the row circuit section 140, which includes the second control circuits 141, and a pixel circuit portion (not shown) connected to the organic light-emitting devices 121. The column and row circuit sections 130 and 140 include thin-film transistors, made of amorphous silicon or low-temperature polycrystalline silicon, functioning as switching devices. The column and row circuit sections 130 and 140 may further include capacitors. The first control circuits 131 are connected to each other with the first control lines 132 and also connected to the pixel circuit portion with the first data lines 151. The second control circuits 141 are connected to each other with the second control lines 142 and also connected to the pixel circuit portion with the second data lines 161. The first and second data lines 151 and 161 are used to supply signals to the pixel circuit portion. The signals do not determine only emission brightness. In this embodiment, either the first or second data lines 151 or 161 may be used to supply signals determining emission brightness to the pixel circuit portion.

The connection terminals 171, which are arranged in the terminal section 170, are used to connect an external circuit to the first and second control circuits 131 and 141, the first electrodes, and the second electrode 123. The connection terminals 171 are connected to the external circuit with flexible wiring lines or the like.

A region surrounding the light-emitting section 120 is shown in an enlarged manner in FIG. 1B and actually has a width of several millimeters. The arrangement of the organic light-emitting devices 121 is schematically shown in FIG. 1A. In the case where an organic light-emitting apparatus functioning as a display includes a light-emitting section which has a diagonal measurement of 2.5 inches and which contains a 320×240 array of pixels and each pixel (light-emitting unit) includes a red (R) light-emitting device, a green (G) light-emitting device, and a blue (B) light-emitting device, the pixel has a size of about 160×50 µm. An increase in the number of sub-pixels of the pixel reduces the size of the pixel.

The resin layer 180 extends from the light-emitting section 120 over the first and second data lines 151 and 161. The resin layer 180 follows the patterns of the first and second data lines 151 and 161. The resin layer 180 further extends over the first and second control circuits 131 and 141 and the first and second control lines 132 and 142. With reference to FIG. 1A, the resin layer 180 covers a region slightly wider than a zone containing the light-emitting section 120, the first and second data lines 151 and 161, the first and second control circuits 131 and 141, and the first and second control lines 132 and 142 and therefore has a portion covering none of these components.

Figure 2:
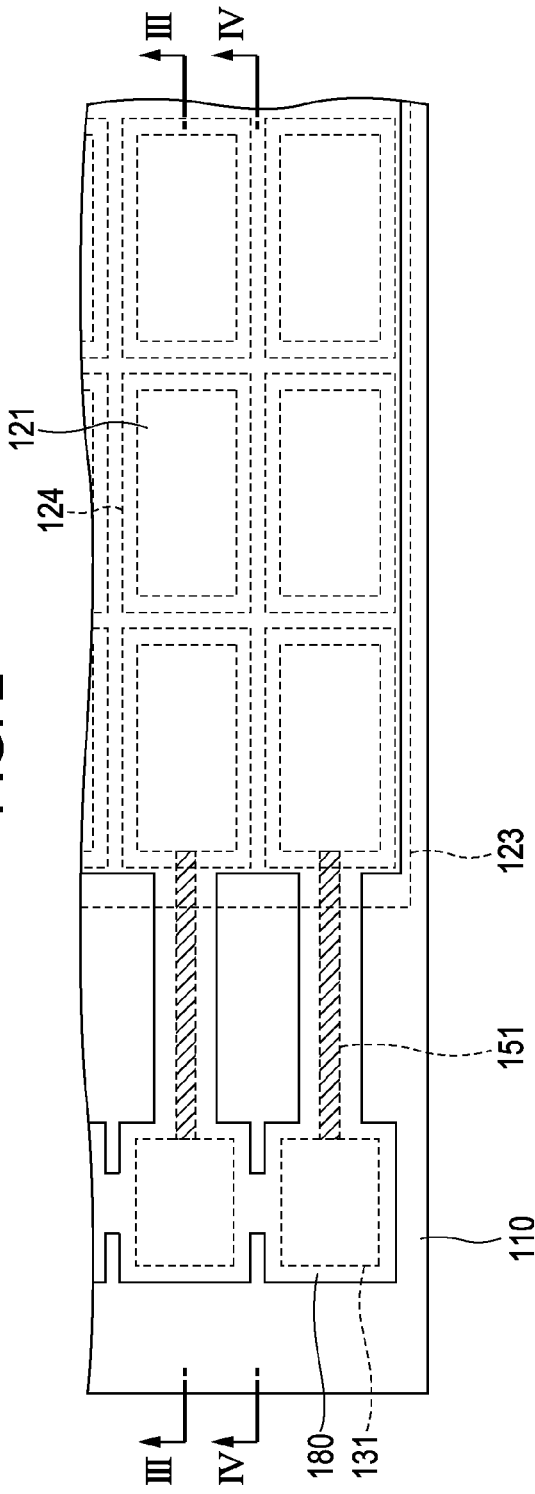
FIG. 2 is an enlarged schematic plan view showing an end portion of a light-emitting section and a circuit section located around the light-emitting section, the light-emitting section and the circuit section being included in the organic light-emitting apparatus shown in FIG. 1.
Figure 3:
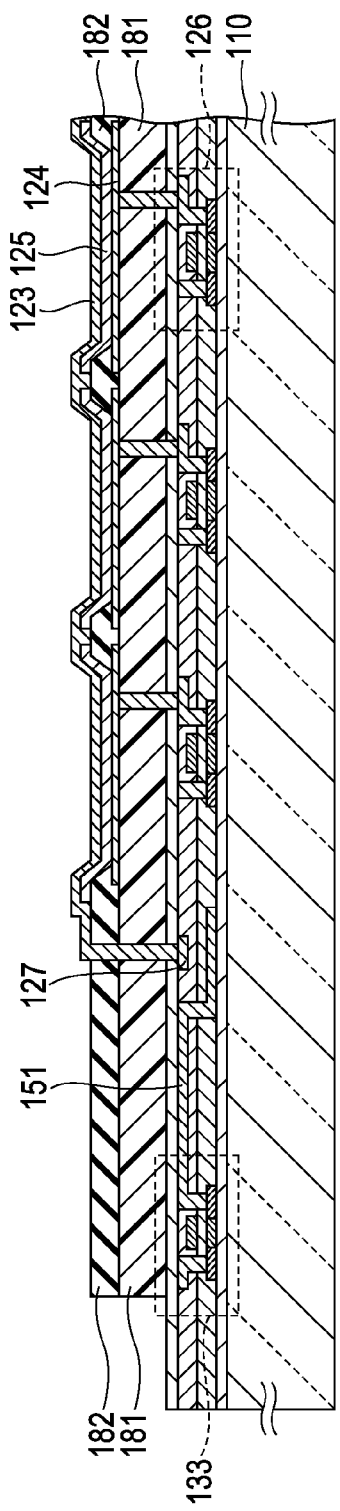
FIG. 3 is a schematic sectional view of the organic light-emitting apparatus taken along the line III-III of FIG. 2.
Figure 4:
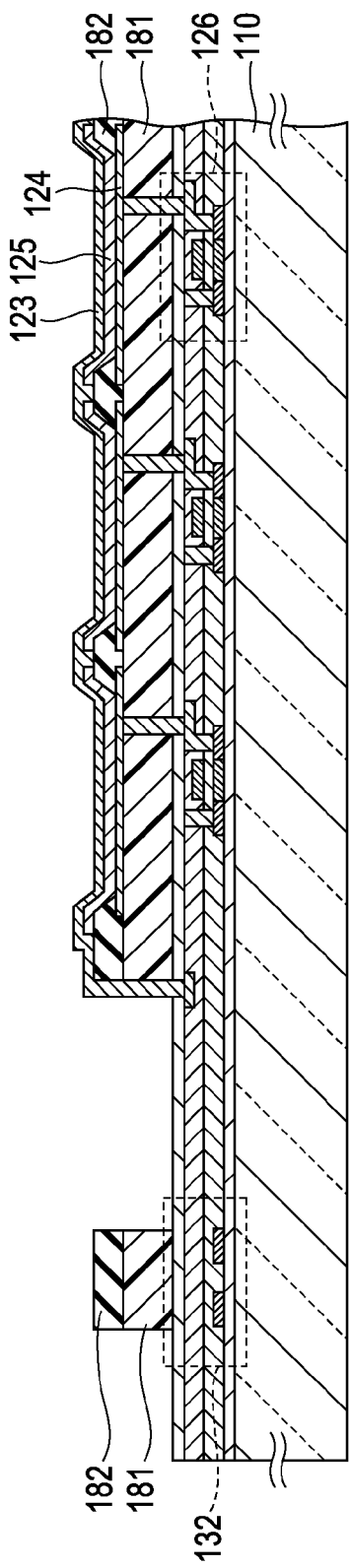
FIG. 4 is a schematic sectional view of the organic light-emitting apparatus taken along the line IV-IV of FIG. 2.

The resin layer 180 will now be further described in detail. FIG. 2 is an enlarged schematic plan view showing an end portion of the light-emitting section 120, the column wiring section 150, and the column circuit section 130, which are arranged around the light-emitting section 120. FIG. 3 is a schematic sectional view of the organic light-emitting apparatus taken along the line III-III of FIG. 2. FIG. 4 is a schematic sectional view of the organic light-emitting apparatus taken along the line IV-IV of FIG. 2. With reference to FIGS. 2 to 4, reference numeral 124 represents the first electrodes, reference numeral 125 represents the organic compound layers, reference numeral 126 represents first thin-film transistors (TFTs) for forming pixel circuits, reference numeral 133 represents second thin-film transistors (TFTs) included in the row or column circuit section 140 or 150, reference numeral 181 represents a first resin sub-layer, and reference numeral 182 represents a second resin sub-layer.

In this embodiment, the resin layer 180 includes the first resin sub-layer 181 and the second resin sub-layer 182. The first resin sub-layer 181 covers irregularities caused by the first thin-film transistors 126; hence, the first electrodes 124, the organic compound layers 125, and the second electrode 123 are flat. This prevents components of the organic light-emitting devices 121 from being broken, being short-circuited, or irregularly emit light. The second resin sub-layer 182 extends between and around the organic light-emitting devices 121 and has a function of electrically insulating the neighboring organic light-emitting devices 121 from each other and a function of preventing organic compounds contained in the neighboring organic light-emitting devices 121 from being mixed together. The first and second resin sub-layers 181 and 182 extend between the second electrode 123 and the first and second data lines 151 and 161. This reduces the capacitance between the second electrode 123 and the first and second data lines 151 and 161.

The first and second resin sub-layers 181 and 182 extend from the light-emitting section 120 over the column and row wiring sections 150 and 160 and follow the patterns of the first and second data lines 151 and 161. Since the first and second resin sub-layers 181 and 182 extend over the column and row wiring sections 150 and 160, the column and row wiring sections 150 and 160 can be securely protected from external impact and the like. The resin layer 180 has gaps which extend between the first and second data lines 151 and 161 and through which a layer underlying the first and second data lines 151 and 161 are exposed. This allows the amount of oxygen, moisture, or the like contained in the organic light-emitting apparatus to be minimized, thereby preventing the deterioration of the organic light-emitting devices 121. Since the first and second resin sub-layers 181 and 182 extend from the light-emitting section 120 over the column and row circuit sections 130 and 140 beyond the column and row wiring sections 150 and 160 and follow the patterns of the first and second data lines 151 and 161 as described above, the column and row circuit sections 130 and 140 can be securely protected from external impact and the like.

With reference to FIG. 4, the first and second resin sub-layers 181 and 182 have the same pattern. The first and second resin sub-layers 181 and 182 may have different patterns. One of the first and second resin sub-layers 181 and 182 may have a narrow pattern and the other one may have a wide pattern.

The resin layer 180 may have another configuration instead of that shown in FIGS. 2 to 4. The resin layer 180 may have, for example, any one of configurations shown in FIGS. 5 to 8.

Figure 5:
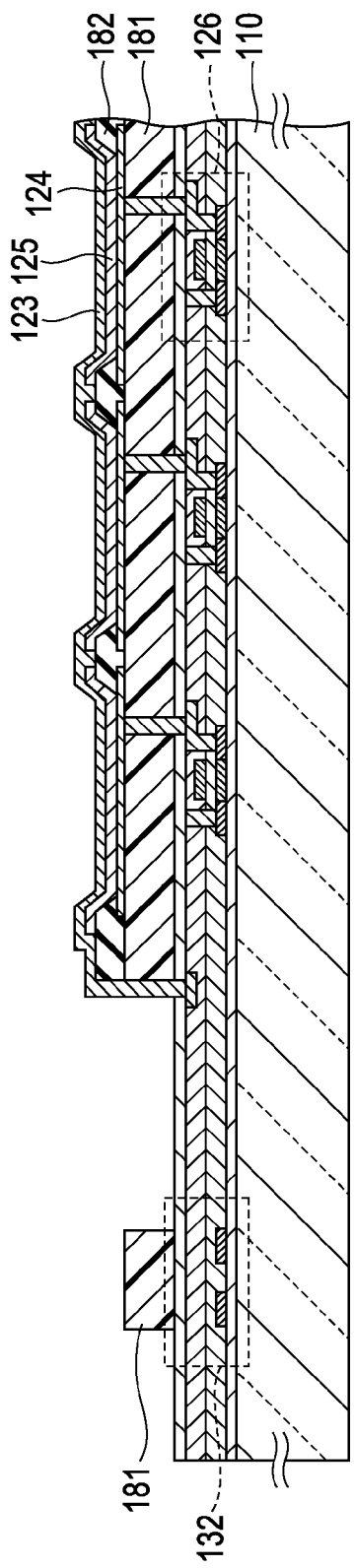
FIG. 5 is a schematic sectional view showing a configuration of an end portion of the organic light-emitting apparatus shown in FIG. 2.
Figure 6:
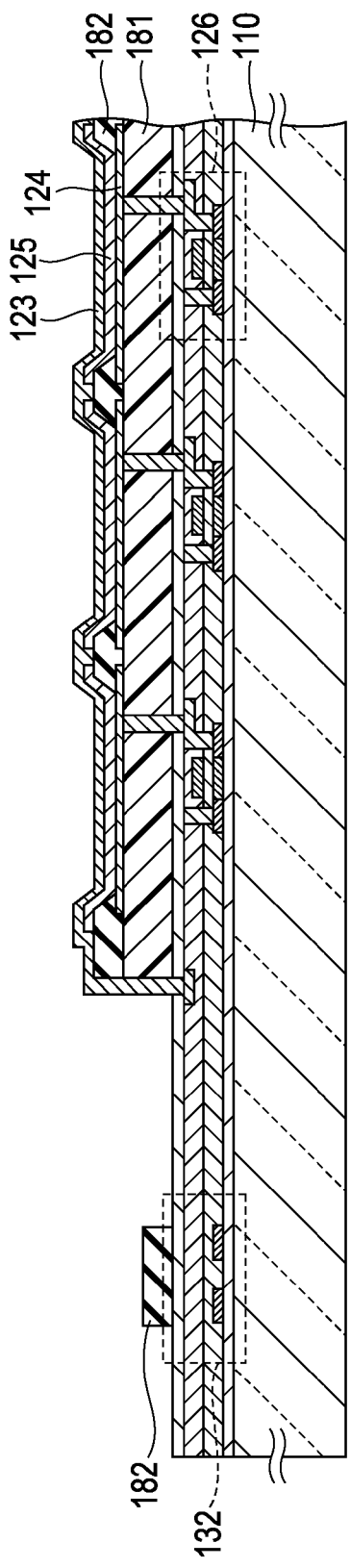
FIG. 6 is a schematic sectional view showing another configuration of the end portion shown in FIG. 2.

FIGS. 5 to 8 are sectional views taken along the line IV-IV of FIG. 2. As shown in FIG. 5, only the first resin sub-layer 181 may extend from the light-emitting section 120 over the column circuit section 130 and may follow the pattern of the column circuit section 130. According to this configuration, the resin layer 180 protects the column circuit section 130 and has a reduced volume. This allows the organic light-emitting apparatus to be resistant to oxygen, moisture, and the like. Alternatively, as shown in FIG. 6, only the second resin sub-layer 182 may extend from the light-emitting section 120 over the column circuit section 130 and may follow the pattern of the column circuit section 130. This configuration provides the same advantage as described above.

Figure 7:
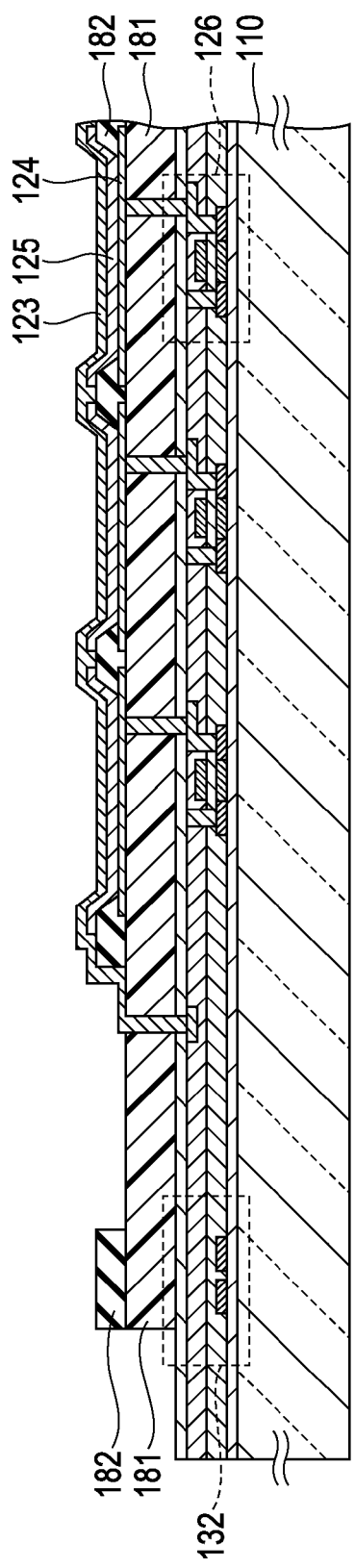
FIG. 7 is a schematic sectional view showing another configuration of the end portion shown in FIG. 2.

As shown in FIG. 7 or 8, only one of the first and second resin sub-layers 181 and 182 may follow the pattern of the column circuit section 130 and the other one may uniformly extend over the column circuit section 130. In this configuration, a portion of the resin layer 180 that extends over the column circuit section 130 is thicker than portions other than this portion. While this configuration causes the organic light-emitting apparatus to contain a larger amount of oxygen, moisture, or the like as compared to the configurations shown in FIG. 4 to 6, this configuration is effective in preventing the second electrode 123 from being broken because this configuration allows the second electrode 123 to have two-stage steps and therefore the distance between sub-steps of each step is small. The configuration shown in FIG. 7 has an advantage that moisture can be readily removed from the first resin sub-layer 181 because the second resin sub-layer 182 is not present between the first data lines 151. The configuration shown in FIG. 8 has an advantage that a portion of the first resin sub-layer 181 that extends over the column circuit section 130 can be prevented from being peeled off because the second resin sub-layer 182 overlies the first resin sub-layer 181.

As shown in FIGS. 9 and 10, the resin layer 180 may further include thin portions 183 which extend between the first data lines 151 and which are thinner than portions of the resin layer 180 that extend over the first data lines 151. That is, a portion of the first resin sub-layer 181 that extends over the column circuit section 130 may be thicker than portions of the first resin sub-layer 181 that extend over portions between the first data lines 151. In this configuration, the first resin sub-layer 181 may have a multilayer structure. The configurations shown in FIGS. 9 and 10, as well as that shown in FIG. 7, have an advantage that moisture can be readily removed from the first resin sub-layer 181 because the second resin sub-layer 182 is not present between the first data lines 151.

Figure 12:
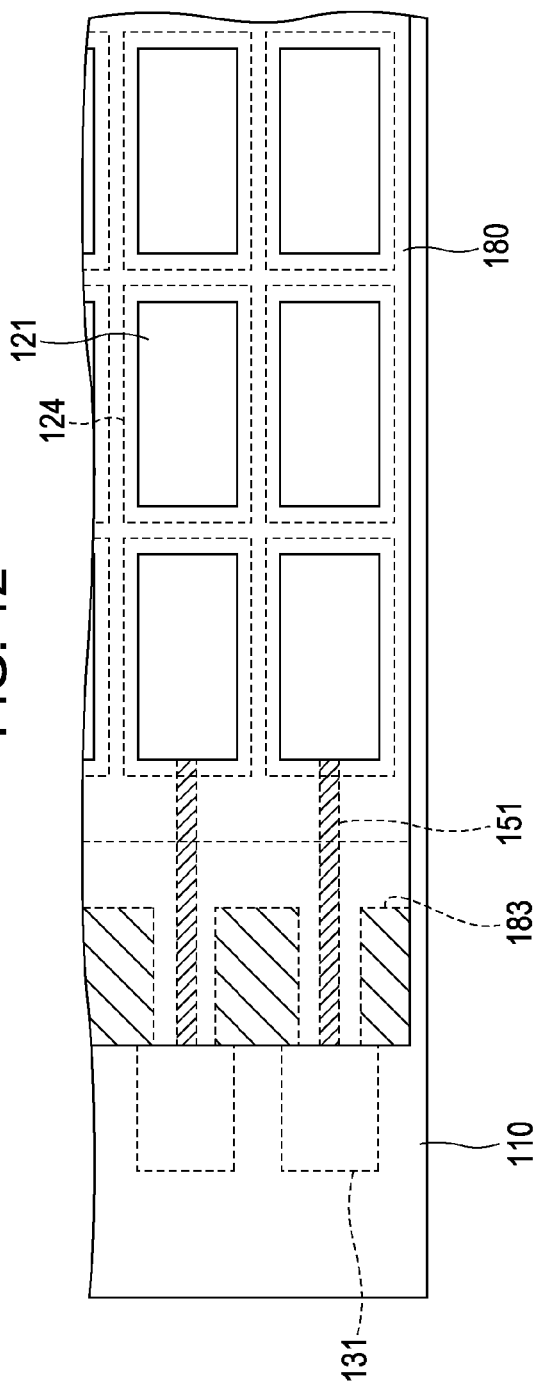
FIG. 12 is a schematic sectional view showing another configuration of the end portion shown in FIG. 2.

As shown in FIG. 11, the resin layer 180 may extend over the column wiring sections 150 without extending over the column circuit section 130. In this case, a layer other than the resin layer 180 is preferably used to protect the column wiring section 150. As shown in FIG. 12, the resin layer 180 may have the thin portions 183. The thin portions 183 are thinner than portions of the resin layer 180 that extend over the first data lines 151.

Figure 13:
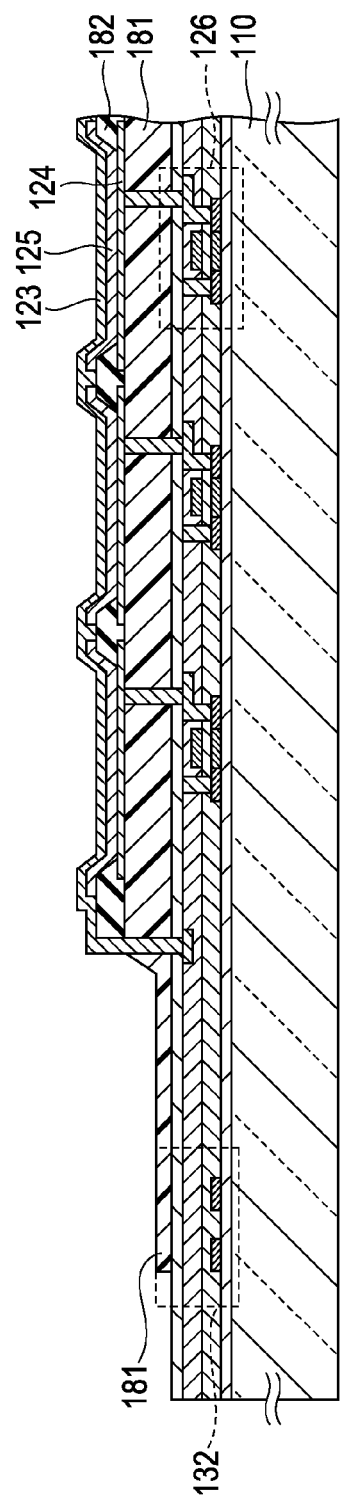
FIG. 13 is a schematic sectional view showing another configuration of the end portion shown in FIG. 2.

As shown in FIG. 13, a portion of the resin layer 180 that extends over the column wiring section 150 and the column circuit section 130 may be thinner than a portion of the resin layer 180 that extends in the light-emitting section 120 and may uniformly extend over the column wiring section 150 and the column circuit section 130 without following the patterns of the column wiring section 150 and the column circuit section 130. According to this configuration, a portion of the resin layer 180 that extends around the light-emitting section 120 has a reduced volume. This allows the resin layer 180 to protect the column circuit section 130 and also allows the organic light-emitting apparatus to contain a reduced amount of oxygen, moisture, or the like.

Figure 14:
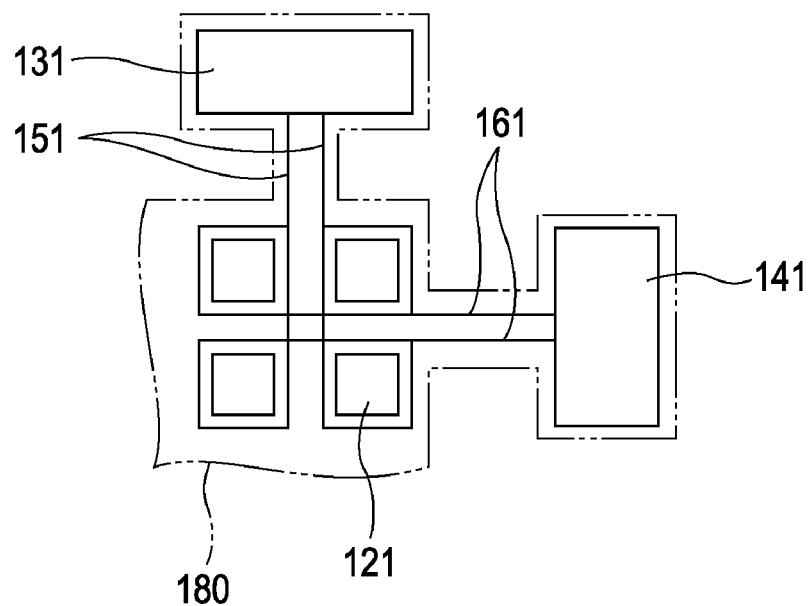
FIG. 14 is a schematic plan view showing a configuration of an end portion of the organic light-emitting apparatus.
Figure 15:
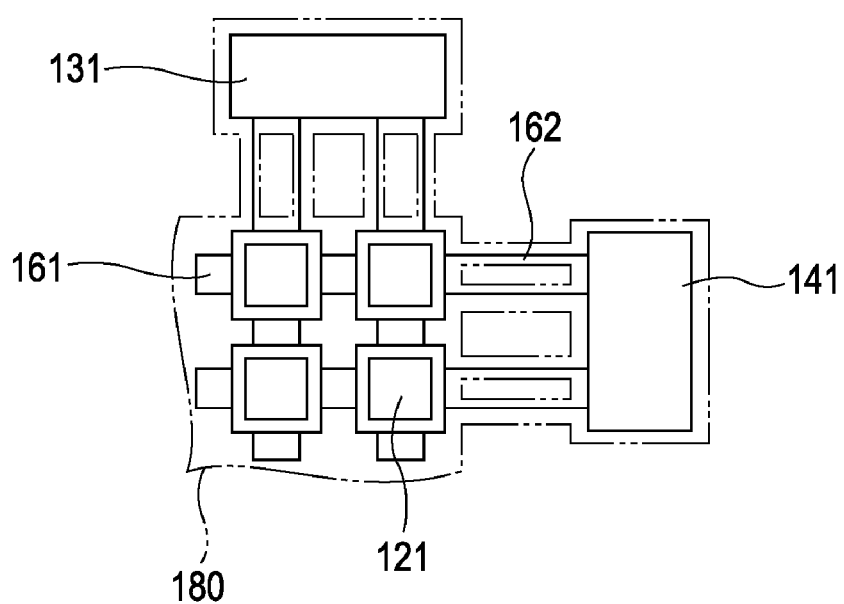
FIG. 15 is a schematic plan view showing another configuration of the end portion of the organic light-emitting apparatus.

The resin layer 180 may have various configurations. The resin layer 180 need not have portions that completely correspond to the shapes of circuit devices and/or wiring lines included in the column or row circuit section 130 or 140. As shown in FIG. 14, the resin layer 180 may have a portion covering a plurality of wiring patterns. Alternatively, as shown in FIG. 15, the resin layer 180 may have portions extending over steps 162 vulnerable to contact if the first and second data lines 151 and 161 have a large width and therefore can be protected without being entirely covered with the resin layer 180.

One or both of the first and second resin sub-layers 181 and 182 may each include a plurality of layer portions having different shapes. The resin layer 180 may be overlaid with an organic material layer for blocking light and/or moisture. In the above description, the resin layer 180 includes both the first and second resin sub-layers 181 and 182. The resin layer 180 need not necessarily include both the first and second resin sub-layers 181 and 182 and may include an inorganic material sub-layer instead of one of the first and second resin sub-layers 181 and 182. The resin layer 180 may include, for example, a sub-layer made of a material such as a metal oxide, silicon dioxide, or silicon nitride. One of the first and second resin sub-layers 181 and 182 may extend over the column and/or row circuit section 130 and/or 140, which is located outside the light-emitting section 120, when the resin layer 180 includes an inorganic material sub-layer.

The resin layer 180 may have portions that have different thicknesses and that correspond to the first thin-film transistors 126 in the light-emitting section 120. The resin layer 180 may have a portion, located at a desired position, having a desired thickness. The first resin sub-layer 181 may have a multilayer structure and may have portions having different thicknesses.

With reference to FIGS. 2 to 4, display pixels are arranged in a matrix array called a striped array. The present invention is not limited to the matrix array. For example, the display pixels may be arranged in a zigzag array called a delta array.

The organic light-emitting apparatus is as described above. The present invention not limited to the above embodiments. When the organic light-emitting apparatus includes a plurality of organic light-emitting devices emitting light of different colors, for example, organic light-emitting devices emitting red (R), green (G), and blue (B) light, the organic light-emitting apparatus can be used as a full-color display. Alternatively, the organic light-emitting apparatus can be used as a display for televisions, PC monitors, cellular phones, and the like. Since the amount of oxygen or moisture in the organic light-emitting apparatus can be minimized, the organic light-emitting apparatus can display a high-quality image for a long time. Alternatively, the organic light-emitting apparatus can be used as a display for imaging systems such as digital cameras. An imaging system equipped with a display including the organic light-emitting apparatus can display a high-quality image for a long time.

Procedures for forming components of the organic light-emitting apparatus will now be described with reference to FIGS. 2 to 4.

Formation of column and row circuit sections and pixel circuits for light-emitting section The substrate 110 is prepared from an inorganic material such as glass, quartz, or silicon. Alternatively, the substrate 110 is prepared from a resin film when the organic light-emitting apparatus is flexible. The following components are formed above the substrate 110: the first thin-film transistors 126, which are included in the pixel circuits for the light-emitting section 120, and the first and second control circuits 131 and 141, which are included in the column and row circuit sections 130 and 140, respectively. In particular, after a base layer is formed on the substrate 110, an amorphous silicon layer is deposited on the base layer, polycrystallized, doped, and then patterned. After a gate-insulating layer is formed on the resulting silicon layer, a gate electrode layer is deposited on the gate-insulating layer and then patterned. After the gate electrode layer is heavily doped, a first insulating layer is deposited on the gate electrode layer and then patterned together with the gate electrode layer. A source/drain electrode layer is deposited on the first insulating layer and then patterned. A second insulating layer is deposited on the source/drain electrode layer and then patterned, whereby the first thin-film transistors 126 are formed. The first and second data lines 151 and 161 and the first and second control lines 132 and 142 are formed together with the gate electrodes or source/drain electrodes of the first thin-film transistors 126 by patterning.

The base layer and the first and second insulating layers may be made of silicon dioxide, silicon nitride, silicon oxide nitride, or the like. The base layer and the first and second insulating layers can be formed by plasma-enhanced chemical vapor deposition (CVD) or the like. The gate electrodes and source/drain electrodes of the first thin-film transistors 126 and wiring lines may be made of a single metal such as tantalum, chromium, tungsten, molybdenum, or aluminum; alloy; or a silicide. The gate electrodes, the source/drain electrodes, and the wiring lines can be formed by a sputtering process or a vapor deposition process. With reference to FIG. 3, reference numeral 127 represents power supply lines connected to the second electrode 123. The power supply lines 127 are formed together with the gate source/drain electrodes. Alternatively, the power supply lines 127 may be formed together with the gate electrodes. The first thin-film transistors 126 may have a top gate structure in which the source/drain electrodes are arranged on the substrate 110 side or a bottom gate structure in which the gate electrodes are arranged on the substrate 110 side. The first thin-film transistors 126 may each include a plurality of gate electrodes or both an n-type gate electrode and a p-type gate electrode.

Formation of First Resin Sub-Layer

The first resin sub-layer 181 is formed over the first thin-film transistors 126 by a coating process and then patterned, whereby the connecting portions (openings or through-holes) 122 are formed in the first resin sub-layer 181 to be connected to the first electrodes 124. The first resin sub-layer 181 is preferably patterned simultaneously with the formation of the connecting portions 122 so as to follow the shapes of the column and row circuit sections 130 and 140, which are located outside the light-emitting section 120. The first resin sub-layer 181 may be formed by a spin-coating process, a roll-coating process, or the like. The first resin sub-layer 181, as well as other patterned layers, may be made of a photoresist. Alternatively, the first resin sub-layer 181 may be made of a photosensitive resin such as an acrylic resin or polyimide.

Formation of First Electrodes

A layer for forming the first electrodes 124 is deposited on the first resin sub-layer 181 by a sputtering process or the like and then patterned, whereby the first electrodes 124 are formed so as to have the same shape as that of the organic light-emitting devices 121. In the case where light is extracted through the first electrodes 124 and then the substrate 110, that is, in the case where the organic light-emitting apparatus is of a bottom emission type, indium tin oxide (ITO), indium zinc oxide (IZO), tin oxide, zinc oxide, indium oxide, or the like can be used to form the first electrodes 124. In the case where light is extracted through the second electrode 123, that is, in the case where the organic light-emitting apparatus is of a top emission type, silver, aluminum, chromium, magnesium, or the like can be used to form the first electrodes 124. These materials can be used in combination to form the first electrodes 124 and the first electrodes 124 may have a multilayer structure. The first electrodes 124 and the second electrode 123 may be anodes and a cathode, respectively, or cathodes and an anode, respectively.

Formation of Second Resin Sub-Layer

The second resin sub-layer 182 is formed on the first resin sub-layer 181 by a coating process and then patterned so as to have openings located at positions corresponding to the organic light-emitting devices 121. In this step, the second resin sub-layer 182 is preferably patterned simultaneously with the formation of the openings so as to follow the shapes of the column and row circuit sections 130 and 140, which are located outside the organic light-emitting devices 121. The second resin sub-layer 182, as well as the first resin sub-layer 181, can be formed by a spin-coating process, a roll-coating process, or the like and may be made of an acrylic resin, polyimide, or the like.

Formation of Organic Compound Layers

The organic compound layers 125 are deposited on the second resin sub-layer 182 by a vacuum vapor deposition process using a metal mask so as to correspond to the organic light-emitting devices 121. In the case where the organic light-emitting devices 121 emit light of different colors, different materials may be deposited on the second resin sub-layer 182 in several batches. In the case where the organic light-emitting devices 121 emit light of a single color, the organic compound layers 125 may be uniformly formed. Charge transport sub-layers and charge injection sub-layers may be uniformly formed. The organic compound layers 125 each include an electron transport sub-layer, a light-emitting sub-layer, and a hole transport sub-layer, which are not shown. The structure of the organic compound layers 125 is not limited to such a three-layer structure. The organic compound layers 125 may have a two-layer structure consisting of the hole transport sub-layer and an electron transport/light-emitting sub-layer or consisting of the electron transport sub-layer and a hole transport/light-emitting sub-layer; a four-layer structure consisting of the electron transport sub-layer, the light-emitting sub-layer, the hole transport sub-layer, and a hole injection sub-layer; or a five-layer structure consisting of the electron transport sub-layer, the light-emitting sub-layer, the hole transport sub-layer, the hole injection sub-layer, and an electron injection sub-layer.

Preferable examples of a hole transport material used include triphenylamines such as N,N'-diphenyl-N,N'-di(3-methylphenyl)-1,1'-diphenyl-4,4'-diamine (TPD) and N,N'-diphenyl-N,N'-dinaphthyl-1,1'-diphenyl-4,4'-diamine (NPD); heterocyclic compounds such as N-isopropylcarbazole, biscarbazole derivatives, pyrazoline derivatives, stilbene derivatives, hydrazone derivatives, oxadiazole derivatives, and phthalocyanine derivatives; and polymers such as polycarbonates, polystyrenes, polyvinylcarbazoles, polysilanes, and polyphenylenevinylenes having a group derived from any one of the triphenylamines and the heterocyclic compounds.

Materials used to form the light-emitting sub-layer are 8-hydroxyquinoline aluminum and anthracene or pyrene. Furthermore, at least one of the following materials can be used to form the light-emitting sub-layer: bisstyrylanthracene derivatives; tetraphenylbutadiene derivatives; coumarin derivatives; oxadiazole derivatives; distyrylbenzene derivatives; pyrrolopyridine derivatives; perinone derivatives; cyclopentadiene derivatives; and thiadiazolopyridine derivatives; and polymers such as polyphenylenevinylene derivatives, polyparaphenylene derivatives, and polythiophene derivatives. Examples of a dopant added to the light-emitting sub-layer include rubrene, quinacridone derivatives, Phenoxazone 660, DCM1, perinone, perylene, Coumarin 540, and diazaindacene derivatives.

Examples of an electron transport material used include 8-hydroxyquinoline aluminum, hydroxybenzoquinoline beryllium, oxadiazole derivatives such as 2-(4-biphenyl)-5-(4-t-butylphenyl)-1,3,4-oxadiazole (t-BuPBD), oxadiazole dimer derivatives, 1,3-bis(4-t-butylphenyl-1,3,4-oxadiazolyl) biphenylene (OXD-1), 1,3-bis(4-t-butylphenyl-1,3,4-oxadiazolyl) phenylene (OXD-7), triazole derivatives, and phenanthroline derivatives.

The above materials can be used alone to form the hole transport sub-layer, the light-emitting sub-layer, or the electron transport sub-layer or can be used in such a manner that each material is dispersed in a solvent-soluble or curable resin serving as a polymeric binder. Examples of the solvent-soluble resin include polyvinyl chlorides, polycarbonates, polystyrenes, poly(N-vinylcarbazole), polymethylmethacrylates, polybutylmethacrylates, polyesters, polysulfones, polyphenylene ethers, polybutadienes, hydrocarbon resins, ketone resins, phenoxy resins, and polyurethanes. Examples of the curable resin include phenol resins, xylene resins, petroleum resins, urea resins, melamine resins, unsaturated polyesters, alkyd resins, epoxy resins, and silicone resins.

Formation of Second Electrode

The second electrode 123 is uniformly deposited over the light-emitting section 120 by a sputtering process or the like. The second electrode 123 is preferably formed so as to be slightly greater than the light-emitting section 120 and so as to be connected to the power supply lines 127. When the organic light-emitting apparatus is of the above bottom emission type, silver, aluminum, chromium, magnesium, or the like can be used to form the second electrode 123. When the organic light-emitting apparatus is of the above top emission type, indium tin oxide (ITO), indium zinc oxide (IZO), tin oxide, zinc oxide, indium oxide, or the like can be used to form the second electrode 123. These materials may be used in combination to form the second electrode 123. The second electrode 123 may have a multilayer structure.

Formation of Sealing Member

After the organic light-emitting devices 121 are formed, the organic light-emitting devices 121 are preferably sealed with a glass member, having a groove, for blocking oxygen, moisture, or the like with an adhesive layer disposed therebetween. A moisture absorbent is preferably placed in the space between the glass member and the organic light-emitting devices 121. A protective layer made of silicon nitride, silicon oxide nitride, or the like may be deposited over the second electrode 123 by a plasma-enhanced CVD process or the like.

EXAMPLES

Examples of the present invention will now be described in comparison with comparative examples. The present invention is not limited to the examples.

Example 1

An organic light-emitting apparatus was prepared as described below.

A second insulating layer for forming thin-film transistors was formed and then patterned by the same procedure as that described in the above embodiment. A layer of the acrylic resin PC415 available from JSR Corporation was formed on the second insulating layer by a spin-coating process at a rotation speed of about 1,200 rpm. After being pre-baked, this layer was exposed to light at an intensity of about 100 mW/cm$^2$ using a photomask having a pattern corresponding to the first data lines 151 shown in FIG. 11 and connection openings (through-holes). This resulting layer was developed with the developer NMD-3 available from Tokyo Ohka Kogyo Co., Ltd. and then post-baked at about 200° C., whereby a first resin sub-layer was formed. The first resin sub-layer had a thickness of about 1.5 μm. The distance $L_1$ from a light-emitting section to a first end portion of the first resin sub-layer and the distance $L_2$ from the light-emitting section to a second end portion thereof were about 0.5 mm and 0.1 mm, respectively.

An aluminum layer with a thickness of about 10 nm and an ITO layer with a thickness of about 40 nm were deposited on the first resin sub-layer by a sputtering process and then patterned, whereby first electrodes having a multilayer structure were formed.

A layer of the acrylic resin PC415 available from JSR Corporation was formed on the first resin sub-layer by a spin-coating process at a rotation speed of about 2,000 rpm. After being pre-baked, this layer was exposed to light at an intensity of about 100 mW/cm$^2$ using a photomask having a pattern corresponding to the openings shown in FIG. 10. This resulting layer was developed with the developer NMD-3 available from Tokyo Ohka Kogyo Co., Ltd. and then post-baked at about 200° C., whereby a second resin sub-layer was formed. The second resin sub-layer had a thickness of about 0.5 μm and had portions uniformly extending over circuit sections. The distance from the light-emitting section to a lengthwise end portion of the second resin sub-layer and the distance from the light-emitting section to a widthwise end portion thereof were about 0.6 mm and 0.2 mm, respectively.

After the workpiece including the second resin sub-layer was heated at 150° C. and 10$^{-2}$ Pa for ten minutes in a chamber of a vacuum system equipped with a mask alignment mechanism, organic compound layers were formed on the second resin sub-layer at 10$^{-4}$ Pa by vapor deposition using a mask. In particular, N'-α-dinaphthylbenzidine (α-NPD) was deposited on the second resin sub-layer, whereby hole transport sub-layers with a thickness of about 60 nm were formed. Coumarin (1.0% by weight) and tris(8-hydroxyquinoline) aluminum (Alq3) were co-deposited on the hole transport sub-layers, whereby light-emitting sub-layers with a thickness of about 30 nm were formed. A phenanthroline compound was deposited on the light-emitting sub-layers, whereby electron transport sub-layers with a thickness of about 10 nm were formed. The phenanthroline compound and cesium carbonate serving as an alkali-metal dopant were deposited on the electron transport sub-layers, whereby electron injection sub-layers with a thickness of about 40 nm were formed.

ITO was deposited over the organic compound layers by a sputtering process, whereby a second electrode with a thickness of about 60 nm was formed.

The workpiece including the second electrode was transferred into a glove box maintained at a dew point of −70° C. or less. A commercially available moisture absorbent was attached to a glass member having a groove. The glass member was bonded to the workpiece with an ultraviolet-curable resin such that the moisture absorbent was opposed to the second electrode.

The organic light-emitting apparatus prepared as described above was subjected to a high-temperature storage test at 80° C. for 1,000 hours. The deterioration of peripheral portions of the resulting organic light-emitting apparatus was too slight to be detected by visual inspection.

Comparative Example 1

An organic light-emitting apparatus was prepared by substantially the same method as that described in Example 1 except that an end portion of a first resin sub-layer was uniformly formed in the same way as that to cover the first data lines 151 shown in FIG. 11. In the organic light-emitting apparatus, the distance from a light-emitting section to a lengthwise end portion of a resin layer and the distance from the light-emitting section to a widthwise end portion thereof were both 0.5 mm. The organic light-emitting apparatus was subjected to a high-temperature storage test at 80° C. for 1,000 hours. The visual inspection of the resulting organic light-emitting apparatus showed that peripheral portions of the light-emitting section were so deteriorated that the deterioration of display performance was recognized.

Example 2

An organic light-emitting apparatus was prepared by substantially the same method as that described in Example 1 except that a second resin sub-layer was 0.05 mm wider than a first resin sub-layer.

The organic light-emitting apparatus was subjected to a high-temperature storage test at 80° C. for 1,000 hours. The deterioration of peripheral portions of the resulting organic light-emitting apparatus was too slight to be detected by visual inspection.

Example 3

An organic light-emitting apparatus was prepared by substantially the same method as that described in Example 1 except those described below. A first resin sub-layer with a two-layer structure was formed in such a manner that two layer portions which had a thickness of about 0.8 μm, that is, which were thinner than the first resin sub-layer described in Example 1 were formed by a spin-coating process at a rotation speed of about 1,500 rpm. The primary one was not formed over a light-emitting section but was formed only over a portion corresponding to the pattern of the first data lines 151 shown in FIG. 11. In particular, the primary one was formed so as to be 0.02 mm wider than the pattern of the first data lines 151. The secondary one, as well as the first resin sub-layer described in Example 1, was formed so as to extend from the light-emitting section to a circuit section and so as to have a pattern corresponding to the first data lines 151 shown in FIG. 10. This allowed the pattern corresponding to the first data lines 151 to have a thickness greater than that of other portions. Since data lines extended under organic light-emitting devices, portions of an organic layer that were disposed on the data lines were convex. Irregularities of the organic layer were gentle and therefore caused no problem. The convex portions had a tilt angle of about ten degrees and therefore caused no problem. The resin layer had convex portions having a tilt angle of less than ten degrees and a height of about 1 μm. These convex portions caused no problem.

The organic light-emitting apparatus was subjected to a high-temperature storage test at 80° C. for 1,000 hours. The deterioration of peripheral portions of the resulting organic light-emitting apparatus was too slight to be detected by visual inspection.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-155373 filed on Jun. 12, 2007, which is hereby incorporated by reference herein in its entirety.

What is claimed is:

1. An organic light-emitting apparatus comprising:
a substrate;
a plurality of organic light-emitting devices which are arranged above the substrate and which form a light-emitting section;
a circuit section which is disposed around the light-emitting section and which controls the operation of the organic light-emitting devices;
a plurality of wiring lines between the light-emitting section and the circuit section, each wiring line extending from the light-emitting section to the circuit section; and
a resin layer arranged in the light-emitting section and extending from the light-emitting section to the circuit section,
wherein the resin layer has gaps following a pattern of the wiring lines between the light-emitting section and the circuit section.

2. The organic light-emitting apparatus according to claim 1, wherein the resin layer extends from the light-emitting section over the circuit section beyond the wiring lines.

3. The organic light-emitting apparatus according to claim 1, wherein the organic light-emitting devices each include a first electrode, an organic compound layer, and a portion of a second electrode arranged above the substrate in that order and the resin layer includes a first resin sub-layer arranged between the substrate and the first electrode in the light-emitting section.

4. The organic light-emitting apparatus according to claim 1, wherein the organic light-emitting devices each include a first electrode, an organic compound layer, and a portion of a second electrode arranged above the substrate in that order and the resin layer includes a second resin sub-layer arranged between and around the organic light-emitting devices.

5. The organic light-emitting apparatus according to claim 1, wherein the organic light-emitting devices each include a first electrode, an organic compound layer, and a portion of a second electrode arranged above the substrate in that order; the resin layer includes a first resin sub-layer arranged between the substrate and the first electrode in the light-emitting section and a second resin sub-layer arranged between and around the organic light-emitting devices; and one of the first and second resin sub-layers extends from the light-emitting section over the wiring lines.

6. An organic light-emitting apparatus comprising:
a substrate;
a plurality of organic light-emitting devices which are arranged above the substrate and which form a light-emitting section;
a circuit section which is disposed around the light-emitting section and which controls the operation of the organic light-emitting devices;
a plurality of wiring lines between the light-emitting section and the circuit section, each wiring line extending from the light-emitting section to the circuit section; and
a resin layer arranged in the light-emitting section and extending from the light-emitting section to the circuit section,
wherein the resin layer has first portions arranged over the wiring lines and second portions arranged between the wiring lines, said second portions are thinner than the first portions.

7. The organic light-emitting apparatus according to claim 6, wherein the resin layer extends from the light-emitting section over the circuit section beyond the wiring lines.

8. The organic light-emitting apparatus according to claim 6, wherein the organic light-emitting devices each include a first electrode, an organic compound layer, and a portion of a second electrode arranged above the substrate in that order and the resin layer includes a first resin sub-layer arranged between the substrate and the first electrode in the light-emitting section.

9. The organic light-emitting apparatus according to claim 6, wherein the organic light-emitting devices each include a first electrode, an organic compound layer, and a portion of a second electrode arranged above the substrate in that order and the resin layer includes a second resin sub-layer arranged between and around the organic light-emitting devices.

10. The organic light-emitting apparatus according to claim 6, wherein the organic light-emitting devices each include a first electrode, an organic compound layer, and a portion of a second electrode arranged above the substrate in that order; the resin layer includes a first resin sub-layer arranged between the substrate and the first electrode in the light-emitting section and a second resin sub-layer arranged between and around the organic light-emitting devices; and one of the first and second resin sub-layers extends from the light-emitting section over the wiring lines.

11. An organic light-emitting apparatus comprising:
a substrate;
a plurality of organic light-emitting devices which are arranged above the substrate and which form a light-emitting section;
a circuit section which is disposed around the light-emitting section and which controls the operation of the organic light-emitting devices;
a plurality of wiring lines extending from the light-emitting section to the circuit section; and
a resin layer arranged in the light-emitting section, arranged around the light-emitting section and extending from the light-emitting section to the circuit section,
wherein the maximum thickness of the resin layer that is arranged around the light-emitting section and extends from the light-emitting section to the circuit section is thinner than the maximum thickness of the the resin layer arranged in the light-emitting section.

12. The organic light-emitting apparatus according to claim 11, wherein the resin layer extends from the light-emitting section over the circuit section beyond the wiring lines.

13. The organic light-emitting apparatus according to claim 11, wherein the organic light-emitting devices each include a first electrode, an organic compound layer, and a portion of a second electrode arranged above the substrate in that order and the resin layer includes a first resin sub-layer arranged between the substrate and the first electrode in the light-emitting section.

14. The organic light-emitting apparatus according to claim 11, wherein the organic light-emitting devices each include a first electrode, an organic compound layer, and a portion of a second electrode arranged above the substrate in that order and the resin layer includes a second resin sub-layer arranged between and around the organic light-emitting devices.

15. The organic light-emitting apparatus according to claim 11, wherein the organic light-emitting devices each include a first electrode, an organic compound layer, and a portion of a second electrode arranged above the substrate in that order; the resin layer includes a first resin sub-layer arranged between the substrate and the first electrode in the light-emitting section and a second resin sub-layer arranged between and around the organic light-emitting devices; and one of the first and second resin sub-layers extends from the light-emitting section over the wiring lines.

16. An organic light-emitting apparatus comprising:
a substrate;
a plurality of organic light-emitting devices which are arranged above the substrate and which form a light-emitting section;
a circuit section which is disposed around the light-emitting section and which controls the operation of the organic light-emitting devices;
a plurality of wiring lines extending from the light-emitting section to the circuit section; and
a resin layer arranged in the light-emitting section, arranged around the light-emitting section and extending from the light-emitting section to the circuit section, wherein the maximum thickness of the resin layer that is arranged around the light-emitting section and extends from the light-emitting section to the circuit section is thinner than the maximum thickness of the resin layer arranged in the light-emitting section.

17. The organic light-emitting apparatus according to claim 16, wherein portions of the resin layer that extend over the wiring lines are thinner than a portion of the resin layer that extends in the light-emitting section.

18. The organic light-emitting apparatus according to claim 16, wherein the organic light-emitting devices each include a first electrode, an organic compound layer, and a portion of a second electrode arranged above the substrate in that order and the resin layer includes a first resin sub-layer arranged between the substrate and the first electrode in the light-emitting section.

19. The organic light-emitting apparatus according to claim 16, wherein the organic light-emitting devices each include a first electrode, an organic compound layer, and a portion of a second electrode arranged above the substrate in that order and the resin layer includes a second resin sub-layer arranged between and around the organic light-emitting devices.

20. The organic light-emitting apparatus according to claim 16, wherein the organic light-emitting devices each include a first electrode, an organic compound layer, and a portion of a second electrode arranged above the substrate in that order; the resin layer includes a first resin sub-layer arranged between the substrate and the first electrode in the light-emitting section and a second resin sub-layer arranged between and around the organic light-emitting devices; and one of the first and second resin sub-layers extends from the light-emitting section over the wiring lines.

* * * * *